United States Patent [19]
Boyette, Jr.

[11] Patent Number: 5,598,104
[45] Date of Patent: Jan. 28, 1997

[54] BREAKAWAY TEST PROBE ACTUATOR USED IN A PROBING APPARATUS

[75] Inventor: James E. Boyette, Jr., Delray Beach, Fla.

[73] Assignee: International Business Machines Corporation, Armonk, N.Y.

[21] Appl. No.: 322,813

[22] Filed: Oct. 13, 1994

[51] Int. Cl.$^6$ .................................................. G01R 31/02
[52] U.S. Cl. .................................... 324/754; 269/8
[58] Field of Search ................... 439/38, 482; 269/8; 324/72.5, 754; 248/206.5; 279/128

[56] References Cited

U.S. PATENT DOCUMENTS

| | | | |
|---|---|---|---|
| Re. 33,145 | 1/1990 | Palm | 408/76 |
| 4,087,747 | 5/1978 | Deegen et al. | 324/72.5 |
| 4,481,467 | 11/1984 | Alexandersen et al. | 324/72.5 |
| 5,014,001 | 5/1991 | Schmidt et al. | 324/758 |
| 5,204,616 | 4/1993 | Buchanan et al. | 324/761 |

*Primary Examiner*—Ernest F. Karlsen
*Assistant Examiner*—Russell M. Kobert
*Attorney, Agent, or Firm*—Richard A. Tomlin; Andrew J. Dillon

[57] ABSTRACT

A probe positioning apparatus for use in a probe testing system is disclosed. The probe positioning apparatus includes a probe tip, a probe actuator connected to the probe tip, a probe plate coupled to the probe actuator and a magnetic probe plate clamp that magnetically couples the probe plate. The magnetic coupling forms a slip plane that provides collision compliance for the probe positioning apparatus. One embodiment of the magnetic probe clamp uses a set of shoulder screws to provide quick attachment and release of the probe plate from the probe clamp. A second embodiment uses a magnetic shunt to disable the magnetic connection of the clamp from the probe plate.

6 Claims, 4 Drawing Sheets

5,598,104

BREAKAWAY TEST PROBE ACTUATOR USED IN A PROBING APPARATUS

BACKGROUND OF THE INVENTION

1. Technical Field

The present invention relates generally to probing apparatus using test probes, and more specifically to a test probe assembly that is easily disconnectable from the probe apparatus. More specifically still, the present invention relates to a quick disconnect probe assembly that readily breaks away from the probing apparatus upon collision with any other element.

2. Description of the Related Art

Probing apparatus for testing electronic components such as, for example, semiconductor wafers or circuit boards, are well known in the art. The probing apparatus use probe tips for providing electrical connection with device under test (DUT). These probe tips are small and do not endure the rigors of testing well; therefore, the probe tips are replaced frequently. The probe tips are small and they are placed on probe actuators or probe assemblies located well inside the probing apparatus. Thus, it is desirable to remove the probe assemblies from the probing apparatus to change the probe tips.

The probing apparatus usually has a coarse positioning system that moves with very high accelerations. If there is an error in the test file, a collision may occur that might damage either the components within the apparatus or the DUT.

Additionally, some DUT's are very thin and very small in relation to the overall positioned workspace in the probing apparatus. Typically, they are in a pocket in a support cradle that needs a minimum thickness for sufficient stiffness. This requires the probes to be in the pocket during testing, which leads to the possibility for collisions with the product support cradle from the side and rear, as well as with the opposing probe assembly from the front. Traditionally, slide bearing packages for collision compliance require a stack XY arrangement to give a 360° freedom of movement. This stacking makes the mechanism fairly tall.

Trying to limit stack height is important in probe stacking design. First, the distance from the probe tip to the course positions and encoders impacts the accuracy of positioning the probe tip. Any aberration errors in the bearings and distortions in the structure due to settling vibrations are amplified by the distance from the encoder. The encoder head location is used to determine the probe tip location, thus, it is desirable to minimize the distance between the encoder head and the probe tip. Second, the taller the structure to which the probe tip is mounted, the more the probe assembly weighs and the less stiff it is. Moving of a large probe assembly mass should be minimized for coarse positioning performance to be optimal. Further, the structure to which the probe tip is mounted should be as stiff as possible so as not to vibrate significantly due to the acceleration experienced by the probe tip assembly during positioning.

Accordingly, what is needed is a probe tip assembly that is readily removable from the probing apparatus. Further, what is needed is a readily removable probe tip assembly that has collision compliance thus preventing damage to the expensive components or DUT within the probing apparatus. Furthermore, the probe tip assembly must have a low profile so as not to extend the probe tip too far above the course positioned thus leading to a decrease in accuracy of the tip positioning.

SUMMARY OF THE INVENTION

It is therefore one object of the present invention to provide a probing apparatus using test probes.

It is yet another object of the present invention to provide an easily disconnectable test probe assembly from the probe apparatus.

It is still yet another object of the present invention to provide a quick disconnect probe assembly that readily breaks away from the probing apparatus upon collision with any other element.

According to the present invention, a probe positioning apparatus for use in a probe testing system is disclosed. The probe positioning apparatus includes a probe tip, a probe actuator connected to the probe tip, a probe plate coupled to the probe actuator and a magnetic probe plate clamp that magnetically couples the probe plate. The magnetic coupling forms a slip plane that provides collision compliance for the probe positioning apparatus. One embodiment of the magnetic probe clamp uses a set of shoulder screws to provide quick attachment and release of the probe plate from the probe clamp. A second embodiment uses a magnetic shunt to disable the magnetic connection of the clamp from the probe plate.

Further connected to the probe tip assembly is a sensor bracket, which includes an opto-electric sensor for sensing the location of the probe tip, and a collision sensor, such as an inductive proximity sensor, for detecting when the probe plate experiences a collision.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
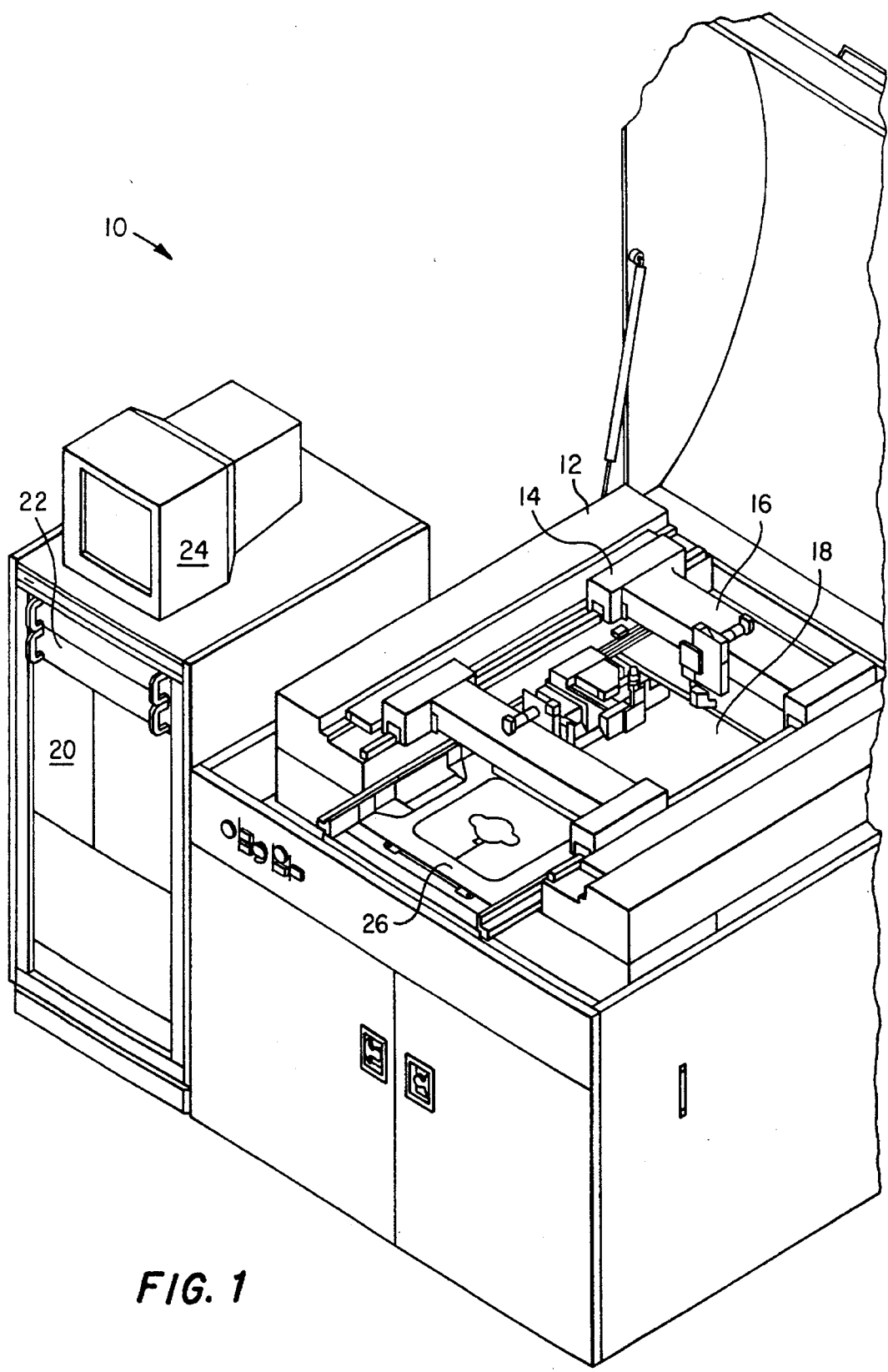
FIG. 1 depicts a perspective view of a probing apparatus used according to the present invention.

FIG. 1 is a perspective view of a test probing apparatus 10. Test probing apparatus 10 further includes a probe positioning assembly 12 and a probe positioning and testing control unit assembly comprising a personal computer 20, a data entry device, such as a keyboard 22, and a data output device, such as a video monitor 24.

Probe positioning apparatus 12 further includes an X positioned assembly 14, for positioning the probe along a first or X axis, a Y positioning assembly 16, for positioning the probe along a second or Y axis, and a probe assembly 18 for positioning the probe along a third or Z axis. The device to be tested, or device under test (DUT), is placed upon a positioning table 26 that slides substantially under the probe assembly for testing of the DUT.

Personal computer 20 is programmed so as to position automatically the probe assembly 18 over the DUT for fast and efficient testing. The profile for each DUT is programmed into computer 20, which allows it to locate the probe assembly 18 precisely onto the DUT without the need for manual positioning of probe assembly 18. Alternatively, probe assembly 18 can be lowered and positioned on the DUT via manual manipulation entering information through keyboard 22 to computer 20 in response to information displayed on video display 24.

Figure 2:
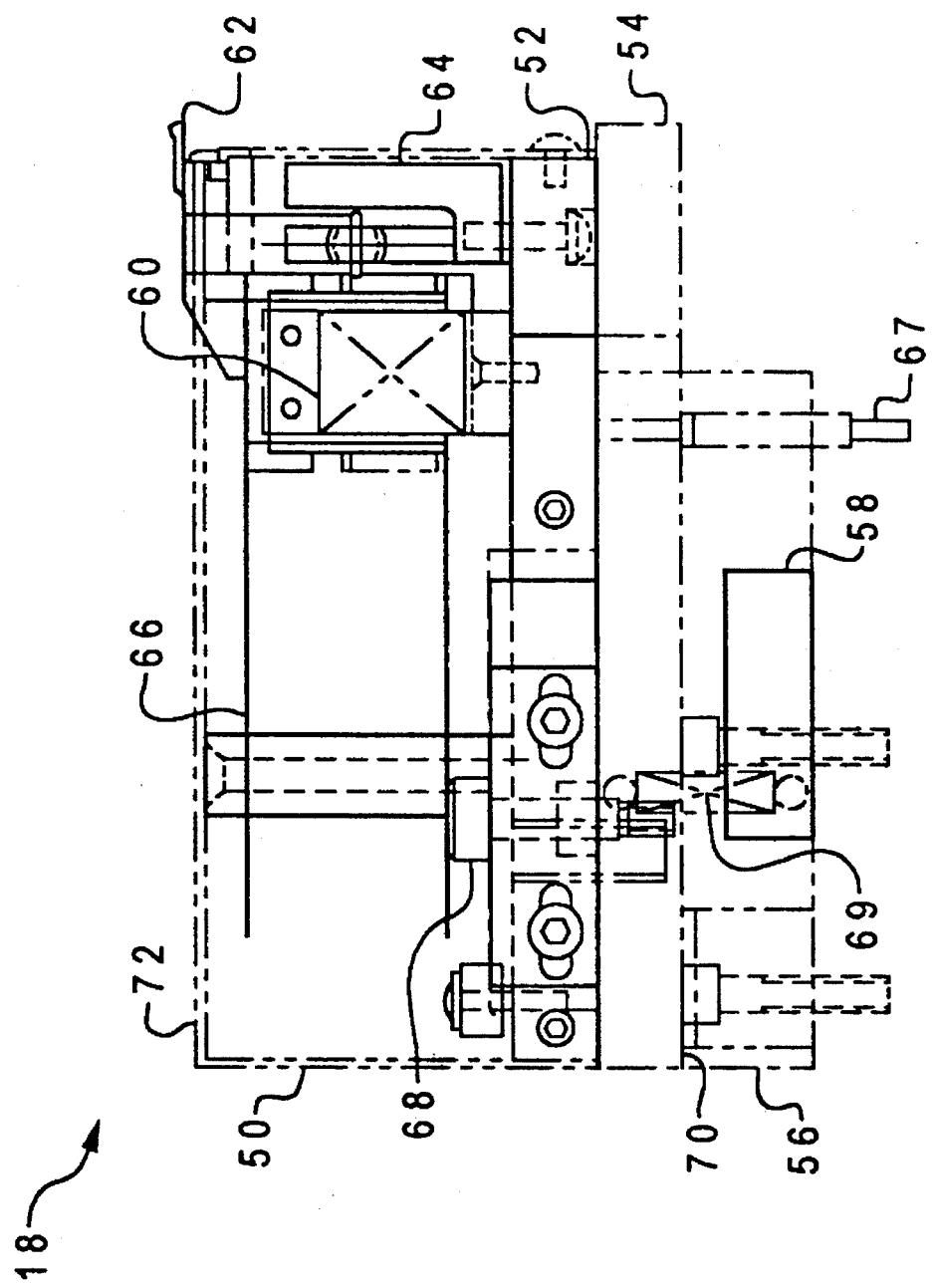
FIG. 2 represents a cut-away side view of a probe tip assembly used in FIG. 1.
Figure 3:
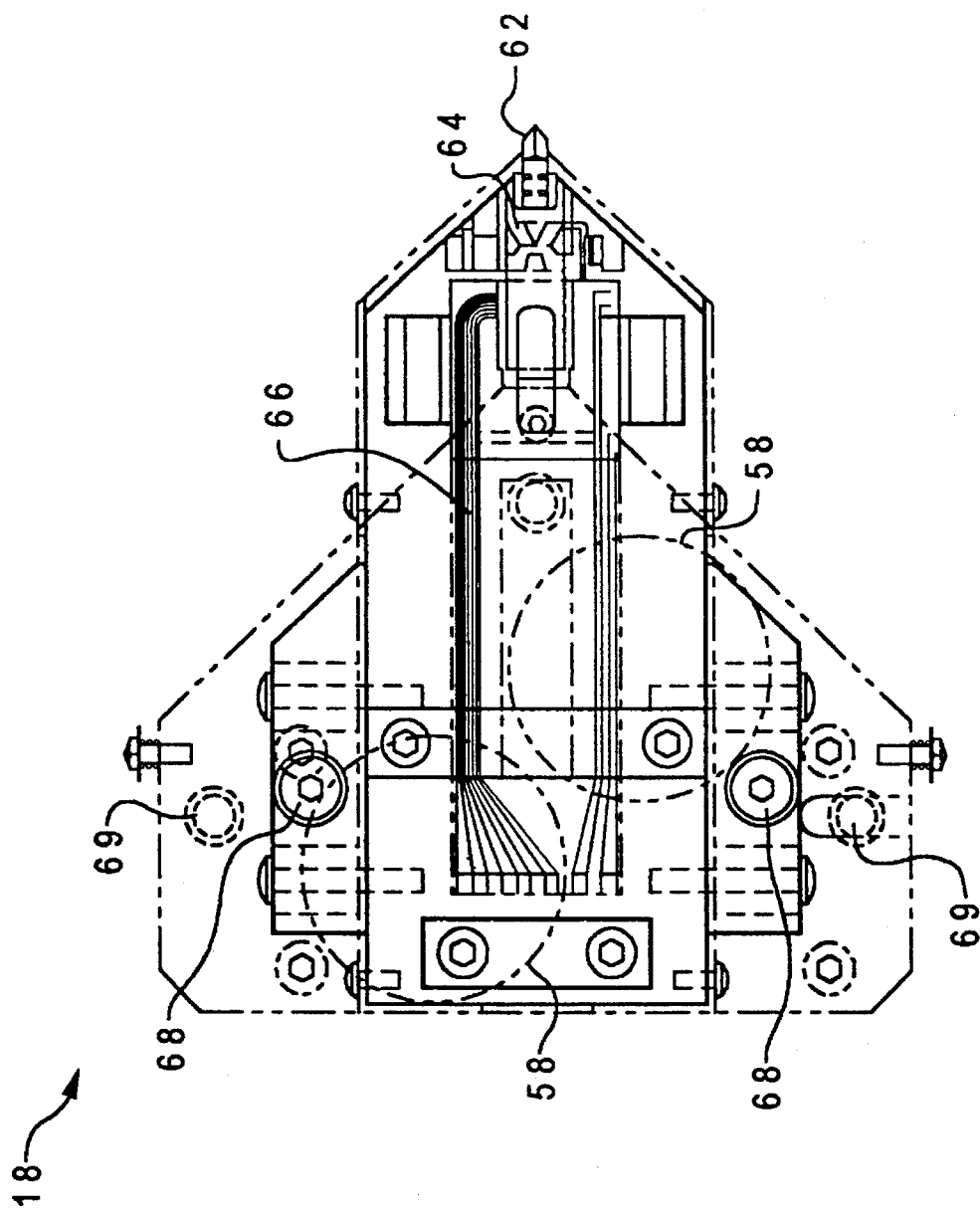
FIG. 3 depicts a top plan cut-away view of the probe tip assembly of FIG. 2.

Probe assembly 18 is more fully depicted in FIGS. 2 and 3. Probe assembly 18 includes a probe positioning unit 50, which is mounted to a probe plate 52. Probe plate 52 further connects to a collision bumper 54, which is made from a magnetizable material such as a ferrous metal or the like. Collision bumper 54 is further connected to a magnetic clamp 56, which securely mounts to X or Y positioning assemblies 14 or 16 in probing apparatus 10 of FIG. 1. Magnets 58 are used to clamp collision bumper 54 with a sufficient enough force so that probe positioning assembly 50 is normally magnetically secured and can slip in the event of a collision with another structure within the probing apparatus 10.

Probe positioning assembly 50 further includes a probe actuator 60 to which a probe tip 62 is mounted. Actuator 60 and probe tip 62 act in response to a sensor bracket 64, which include an opto-electric sensor for sensing the position of probe tip 62 over the DUT. Both actuator 60 and sensor bracket 64 are electrically coupled to the computer in FIG. 1 via flexible cable 66. A collision sensor 67 is located within clamp 56 so as to sense any collision experienced in the assembly. Collision sensor 67 is an inductive proximity sensor used to sense movement of collision bumper 54 with respect to clamp 56.

A pair of shoulder screws 68 are used to provide a quick connect and release necessary to detach probe positioning assembly 50 from collision bumper 54. As the pair of shoulder screws are removed, they release probe plate 52 from collision bumper 54. A second set of shoulder screws 69 are used to provide alignment of collision bumper 54 with magnetic clamp along line 70 56. Also, as shoulder screws 69 are turned, collision bumper 54 is lifted or separated from magnetic clamp 56 sufficiently enough so as to weaken the magnetic field holding the assembly in place. Once collision bumper 54 is sufficiently away from magnetic clamp 56, the operator can manually remove the probe actuator with little effort. Shoulder screws 69 may also be cone point set screws. An alternative assembly for clamping positioning device 50 to the probing assembly is depicted in FIGS. 4 and 5.

Figure 4:
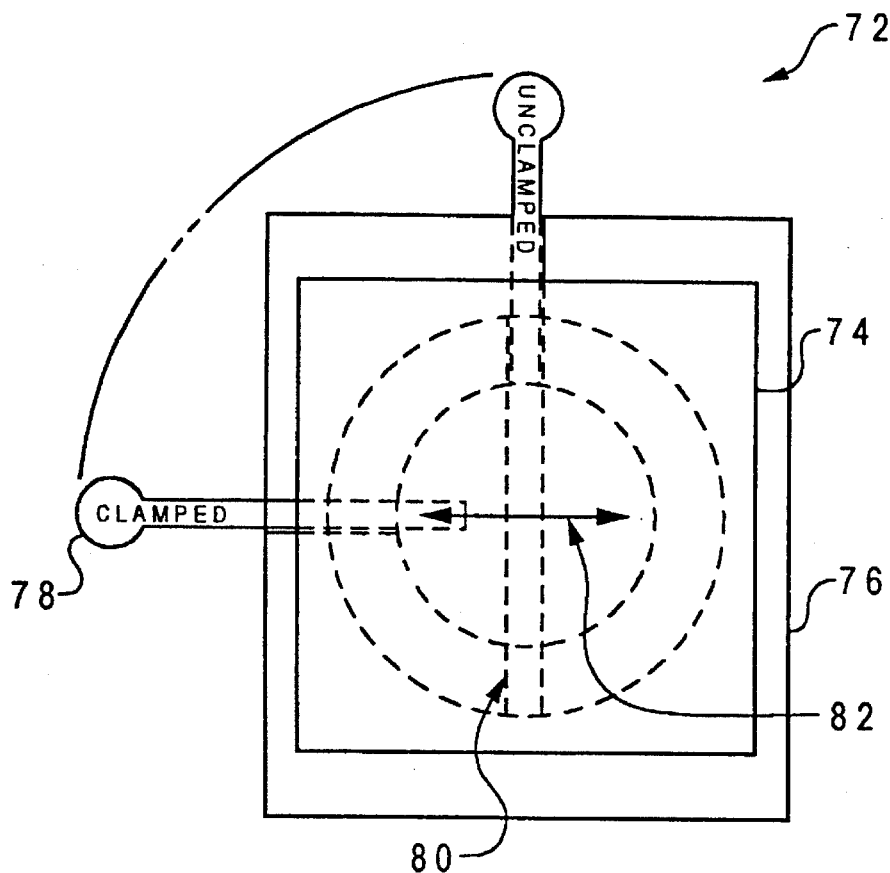
FIG. 4 depicts an alternative embodiment for the quick disconnect feature of the probe tip assembly in FIG. 2.

FIG. 4 depicts a top plan view of a probe clamp 72. FIG. 5 depicts a cut-away side view of clamp 72. Clamp 72 includes a mounting surface 74 and a clamping actuator 76. Actuator 76 includes a clamping lever 78, which can be rotated 90° to place a magnetic shunt 80 in such a position so as to lessen the magnetic force of the magnet along the magnetic orientation 82.

Figure 5:
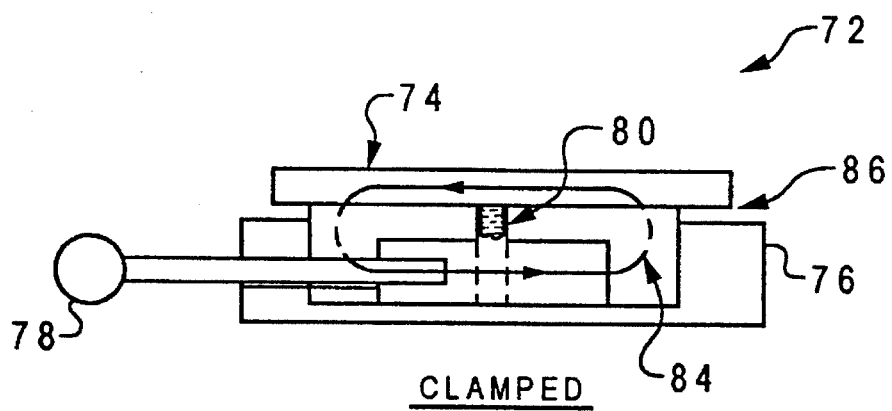
FIG. 5 depicts a cut-away side view of the alternative disconnect apparatus shown in FIG. 4.

When lever 78 is in the clamped position shown in FIG. 5, a magnetic flux path 84 extends into mounting surface 74, thus providing a magnetic force sufficient enough to mount and clamp the probe positioning assembly to the probe clamp 72.

The magnetic flux is sufficient enough to hold the probe positioning assembly rigidly in place during normal operation. By rotating lever 78 90° the magnetic force is shunted through magnetic shunt 80 thus decreasing the magnetic force nearly to zero thereby allowing the probe positioning assembly to be readily removed from the probing apparatus. Probe clamp 72 may further comprise a retaining clip or pin or rod for preventing the probe assembly from falling upon the shunting of the magnetic flux.

The use of the magnetic clamp with collision compliance eliminates the need for traditional slide bearing packages that increase the stack height of the probe positioning assembly. This provides a rigid, repeatable mounting assembly for the probe, with quick disconnect capability in a low profile package.

While the invention has been particularly shown and described with reference to a preferred embodiment, it will be understood by those skilled in the art that various changes in form and detail may be made therein without departing from the spirit and scope of the invention.

I claim:

1. A probe positioning apparatus comprising:

a probe tip;

a probe actuator connected to said probe tip;

a probe plate coupled to said probe actuator;

a magnetic probe plate clamp for magnetically coupling to said probe plate in such a fashion as to provide a slip plane between said probe plate clamp and said probe plate, thus providing collision compliance for said probe positioning apparatus, and wherein said magnetic probe clamp further comprises a magnetic shunt that is moveable along a magnetic flux direction for shunting a magnetic flux used to clamp magnetically said probe positioning apparatus in place.

2. The apparatus according to claim 1, wherein said magnetic probe clamp further comprises mechanical disconnection means for separating said probe plate from said magnetic probe clamp, thus reducing the magnetic force between said probe plate and said magnetic probe clamp for ready removal of said probe positioning apparatus.

3. The apparatus according to claim 2, wherein said mechanical disconnect means comprises a pair of shoulder screws.

4. The apparatus according to claim 1, further comprising a sensor bracket coupled to said probe tip and said probe actuator and further comprising an opto-electric sensor for sensing the location of said probe tip.

5. The apparatus according to claim 1 further comprising a collision sensor coupled to said magnetic probe plate clamp.

6. The apparatus according to claim 5 wherein said collision sensor is an inductive proximity sensor.

* * * * *